(12) United States Patent
Damen et al.

(10) Patent No.: US 8,947,638 B2
(45) Date of Patent: Feb. 3, 2015

(54) ACTUATION SYSTEM AND LITHOGRAPHIC APPARATUS

(75) Inventors: Johannes Wilhelmus Damen, Budel (NL); Martinus Jacobus Coenen, Eindhoven (NL); Hermannus Antonius Langeler, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 451 days.

(21) Appl. No.: 13/299,687

(22) Filed: Nov. 18, 2011

(65) Prior Publication Data

US 2012/0140195 A1 Jun. 7, 2012

Related U.S. Application Data

(60) Provisional application No. 61/419,446, filed on Dec. 3, 2010.

(51) Int. Cl.
| | |
|---|---|
| G03B 27/58 | (2006.01) |
| G03B 27/62 | (2006.01) |
| G04C 13/11 | (2006.01) |
| G03B 27/54 | (2006.01) |
| G03F 7/20 | (2006.01) |

(52) U.S. Cl.
CPC ............ *G03B 27/54* (2013.01); *G03F 7/70758* (2013.01); *G03F 7/70841* (2013.01); *G03F 7/70991* (2013.01)
USPC .............................. 355/72; 355/75; 310/49.02

(58) Field of Classification Search
CPC ............ G03F 7/70841; G03F 7/70991; G03F 7/70758

USPC ........... 355/53, 72–76; 439/578–579; 310/10, 310/12, 49.02
See application file for complete search history.

(56) References Cited

U.S. PATENT DOCUMENTS

| | | | |
|---|---|---|---|
| 6,485,331 B1 * | 11/2002 | Lample ......................... | 439/578 |
| 7,204,716 B1 * | 4/2007 | George et al. ............ | 439/607.41 |
| 7,421,058 B2 * | 9/2008 | Popescu et al. .................. | 378/20 |
| 2004/0174505 A1 * | 9/2004 | Terashima ...................... | 355/30 |

(Continued)

FOREIGN PATENT DOCUMENTS

| | | |
|---|---|---|
| EP | 1 056 162 A2 | 11/2000 |
| JP | 05-020935 A | 1/1993 |

(Continued)

*Primary Examiner* — Hung Henry Nguyen
(74) *Attorney, Agent, or Firm* — Sterne, Kessler, Goldstein & Fox P.L.L.C.

(57) ABSTRACT

Actuation systems and lithographic apparatus which address the issue of uncontrolled return of common mode currents are provided. In an embodiment such systems aim to prevent the occurrence of corona and discharge between high voltage electric cables in low pressure environments. An exemplary actuation system includes comprises an actuator module, a power source and power transmission cables. The actuator module includes an electrical motor and a first plurality of shielded cables configured to connect to the electrical motor at one end. The actuator module is located in a low pressure environment and each shield of the first plurality of cables is grounded. The transmission cables electrically connect the first plurality of cables with power supply, and include an extra cable configured to connect each shield of the first plurality of cables with the first extra cable, via a choke so as to provide a return path for common-mode currents.

8 Claims, 5 Drawing Sheets

(56) References Cited

U.S. PATENT DOCUMENTS

2008/0060828 A1* 3/2008 Shibazaki .................. 174/5 SG
2010/0244898 A1 9/2010 van den Brande et al.

FOREIGN PATENT DOCUMENTS

| JP | 2010-154687 A | 7/2010 |
| WO | WO 2010/121844 A1 | 10/2010 |

* cited by examiner

ACTUATION SYSTEM AND LITHOGRAPHIC APPARATUS

CROSS REFERENCE TO RELATED APPLICATIONS

This application claims the benefit under 35 U.S.C. §119(e) to U.S. Provisional Patent Application No. 61/419,446, filed Dec. 3, 2010, which is incorporated by reference herein in its entirety.

BACKGROUND

1. Field of the Invention

The present invention relates generally to a lithographic apparatus, and more particularly to an actuation system and a lithographic apparatus having the actuation system.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Some moving parts of the lithography apparatus are powered by a high voltage power supply. Furthermore, for some lithographic processes, parts of the lithography apparatus are kept at very low pressure. In Extreme Ultraviolet (EUV) lithography, the lithography process is performed at very low pressure in order to decrease the absorption of the EUV radiation by air. In particular, at very low pressure, a high voltage power supply may be used to power any actuators that are used to position the table on which the substrate is placed, any so-called blades that block a portion of the projection beam or any clamps that hold the mask or the substrate to a table that may be part of the lithography apparatus. Due to the fact that high voltage is used, and in particular because the components are situated in a very low-pressure environment, there is a problem that electrical breakdown may occur (Paschen effect). The possibility of electrical breakdown limits the voltage of the power lines and presents a safety hazard and a lifetime issue. If a full insulation breakdown occurs, it can pollute surfaces of optical components, create electromagnetic interference that disturbs sensitive electronics, cause severe machine damage and present a human safety hazard. Even with partial discharges (ionization corona effect), part of the power line insulation material will be gradually broken down into gaseous form which can also cause pollution of surfaces of optical components and will cause electromagnetic interference to sensitive electronics.

Another issue is that of the uncontrolled return of common mode currents. Common mode currents arise from motion control systems with electric motors (e.g., Wafer Stage). Measurements have shown that the resolution of sensor systems in the machine is deteriorated due to these common mode currents, which interfere with the sensor systems.

SUMMARY

The following presents a simplified summary of the one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

In accordance with one or embodiments and corresponding disclosure thereof, various aspects are described in connection with providing an actuation system with high voltage electric cables in low pressure environments to prevent the occurrence of corona between the cables while also preventing uncontrolled return of common mode currents.

According to one embodiment of the present invention, there is provided actuator system comprising an actuator module comprising at least one actuator and actuator cables configured to connect the at least one actuator to the outside of the actuator module, a power supply for providing power to the at least one actuator, and transmission cables for connecting the power source to the actuator cables. There is provided a common mode signal return conductor from the at least one actuator module to the power supply.

According to a further embodiment of the present invention, there is provided a feed-through connection for providing a hermetic electrical connection between regions having different atmospheric pressures comprising, one or more feed-through conductors, each of which is configured at each end to connect to an electrical cable, and one or more auxiliary feed-through conductors, each of which is insulated from the one or more main feed-through conductors, the feed-through connection being configured at one end to provide for an electrically conductive path from an electrically conductive shielding of at least one of the electrical cables to at least one of the one or more auxiliary feed-through conductors.

According to a further embodiment of the present invention, there is provided lithographic apparatus, comprising: a substrate table configured to hold a substrate, a support constructed to support a patterning device, the patterning device being capable of imparting the radiation beam with a pattern in its cross-section to form a patterned radiation beam, and an actuation system of the first embodiment, being configured to actuate the support, the substrate table, and/or any other feature of the lithographic apparatus. The lithographic apparatus may also comprise a reticle clamp holding a reticle and a shutter to control the light path.

One or more embodiments of the present invention are directed to lithography systems and sub-system including the actuation system.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 6a depicts an exemplary spring configuration for the feedthrough device of FIGS. 5a and 5b when used in the system of FIG. 3a.

Figure 1:
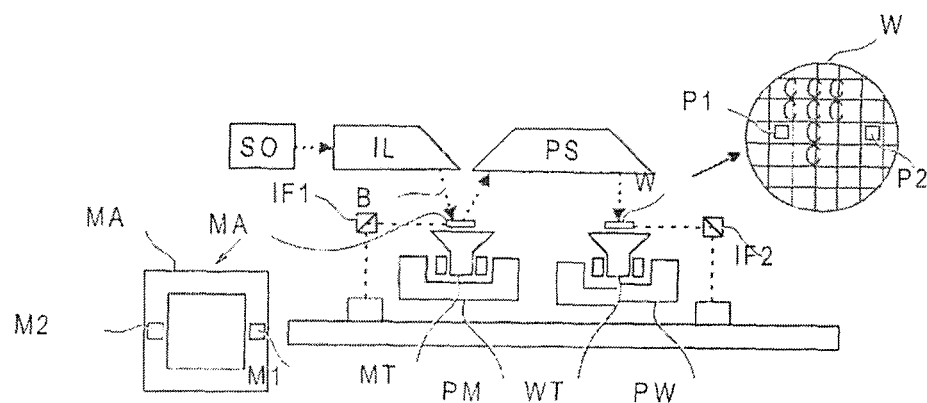
FIG. 1 depicts an exemplary lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts an exemplary lithographic apparatus according to one embodiment of the invention. The apparatus comprises an illumination system (illuminator) IL configured to condition a radiation beam B (e.g., UV radiation or EUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a reflective type (e.g., employing a reflective mask). Alternatively, the apparatus may be of a transmissive type (e.g., employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury or tin based lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

A masking device, which defines the area on the patterning means that is illuminated, may be included in the illuminator IL. The masking device may comprise a plurality of blades, for example four, whose positions are controllable, e.g., by actuators such as stepper motors, so that the cross-section of the beam may be defined. It should be noted that the masking device need not be positioned proximate the patterning means but in general will be located in a plane that is imaged onto the patterning means (a conjugate plane of the patterning means). The open area of the masking means defines the area on the patterning means that is illuminated but may not be exactly the same as that area, e.g., if the intervening optics have a magnification different than 1.

Figure 2:
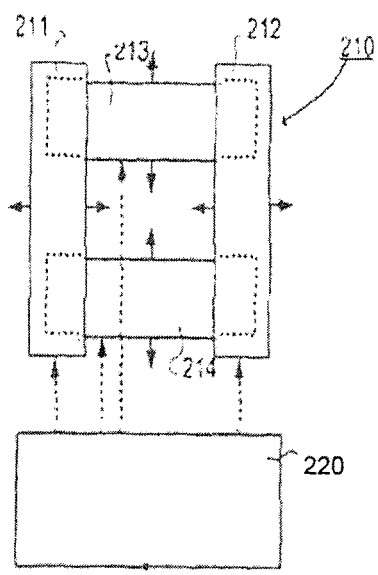
FIG. 2 depicts an exemplary beam interceptor connected to an actuation system according to an embodiment of the invention.

FIG. 2 depicts an exemplary beam interceptor which is comprised in a masking device according to an embodiment of the invention. The beam interceptor 210, comprises opaque blades 211, 212, 213, 214 that are arranged to intercept part of the radiation beam B. The blades 211, 212, 213, 214 manipulate the size and shape of the exposed projection beam B on the mask MA and accordingly on the target portions C. The movement and positioning of the blades 211, 212, 213, 214 is controlled by a control system 220. If a projected target portion C is not fully positioned on the substrate W, the control system 220 is arranged to define a new size for this particular target portion C and actuate the beam interceptor 210 accordingly.

The patterning device (e.g., mask MA) is held on the support structure (e.g., mask table MT) and is patterned by the patterning device. The mask MA can be clamped to the mask table MT on both surfaces of the mask. By clamping the mask MA on both surfaces, the mask can be subjected to large accelerations without slipping or deformation. The clamping, or holding force may be applied using thin membranes, which further prevent deformation of the mask. By the clamp, a normal force between adjacent surfaces of the mask and the mask table MT is generated, resulting in a friction between contacting surfaces of the mask and the mask table. The clamping force to the surfaces of the mask MA may be generated using HV electrostatic or mechanical clamping techniques.

The radiation beam B is incident on the patterning device (e.g., mask MA). Having traversed the mask MA, the radiation beam B passes through the projection system PS, which focuses the beam onto a target portion C of the substrate W. With the aid of the second positioner PW and position sensor IF2 (e.g., an interferometric device, linear encoder or capacitive sensor), the substrate table WT can be moved accurately, e.g., so as to position different target portions C in the path of the radiation beam B. Similarly, the first positioner PM and another position sensor IF1 can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure. The clamping force to the surfaces of the wafer may be generated using HV electrostatic or mechanical clamping techniques.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable (MEMS) mirror array of a type as referred to above.

Combinations and/or variations on the above described modes of use or entirely different modes of use may also be employed.

EP Patent No. 1 056 162 B1, which is incorporated by reference herein in its entirety, discloses a device for controlling an electric field. The device makes use of capacitive field control and geometrical field control. The capacitive field control comprises a plurality of capacitive layers arranged substantially concentrically between an inner live conductor and an outer ground potential. The geometrical field control comprises a stress cone, which is arranged in electrical contact ground potential. However, arcing may still occur from the cables to a nearby conductor. Arcing of this kind is a particular problem when electrical cables are connected in a system at low pressures. In order to overcome this problem U.S. Pat. No. 6,485,331 B1, which is incorporated by reference herein in its entirety, discloses a connection system for electrical cables, which operate under vacuum and carry high voltage electric pulses or currents. This connection system comprises a grounded outer metal shell connected to the metal sheathes of the cables and a dielectric insulating sleeve and confines the electric fields inside the cable sheathes, such that no electric fields occur outside the cable. The insulating sheath and sleeve enclose the cables to be connected. The system is fitted with seals to form a sealed cavity between insulating sleeves of the cables and the insulating sheath. This ensures that the insulators of the connection system remain immersed in a gas atmosphere even when part of the connection system is in a vacuum. This is designed to reduce arcing along the surfaces of insulator junctions of the connection systems. However, it is difficult to prevent leaks in such a system. Any leaks in the interconnect system increase the possibility of arcing, even over long creepage paths.

Embodiments of the present invention provide the first positioner PM, the second positioner PW, the motors that control any blades that may be comprised in the masking device and any clamps that may be comprised in the lithographic projection apparatus are powered by a high voltage power supply. High voltage is taken to mean that the power supply produces an output of the order of hundreds or thousands of volts. In an embodiment, the output of the power supply is greater than 100V, greater than 200V, greater than 500V, greater than 1000V, greater than 2000V, greater than 5000V.

Figure 3A:
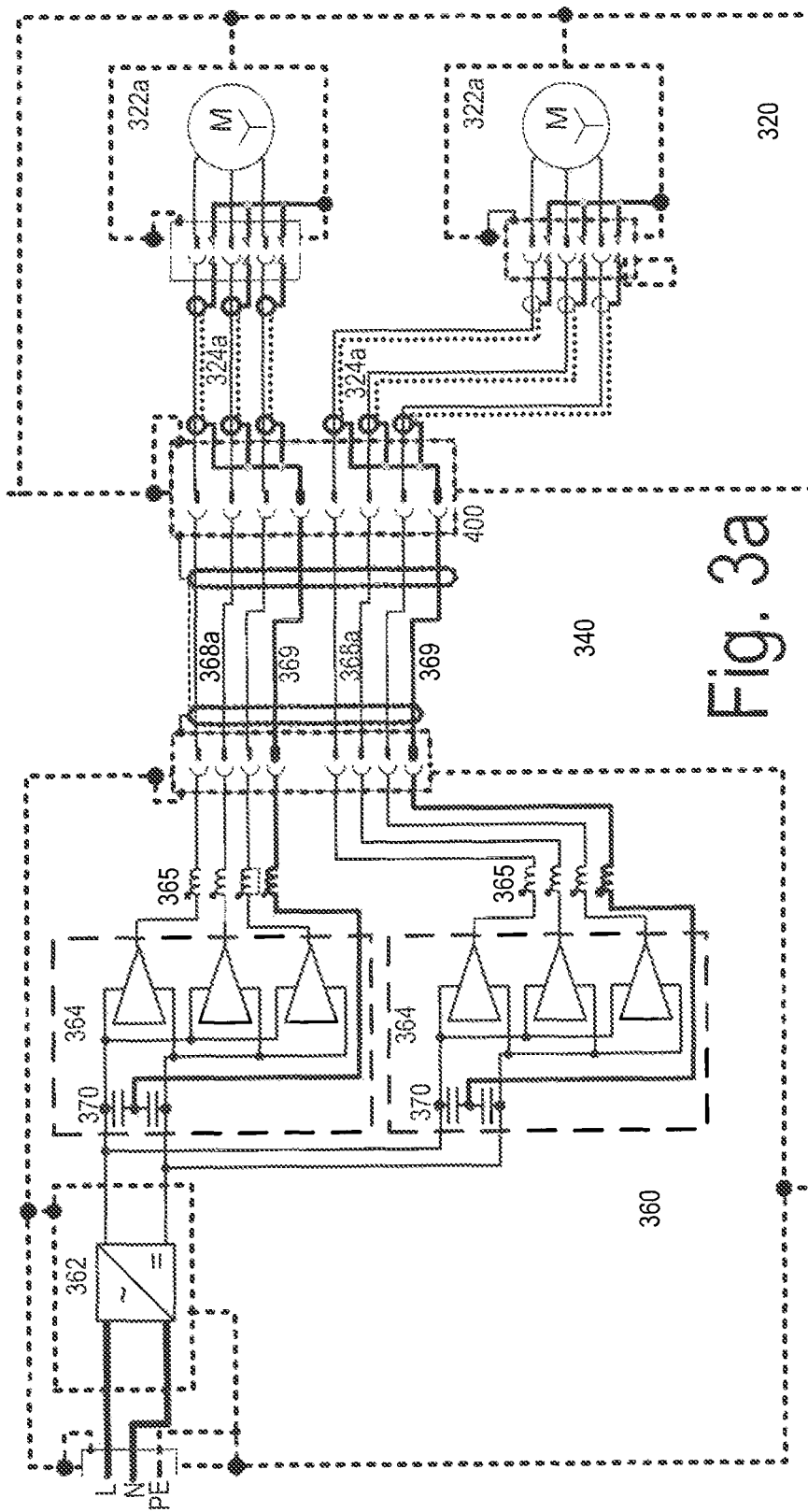
FIGS. 3a and 3b depict an exemplary actuation system according to two embodiments of the invention.
Figure 3B:
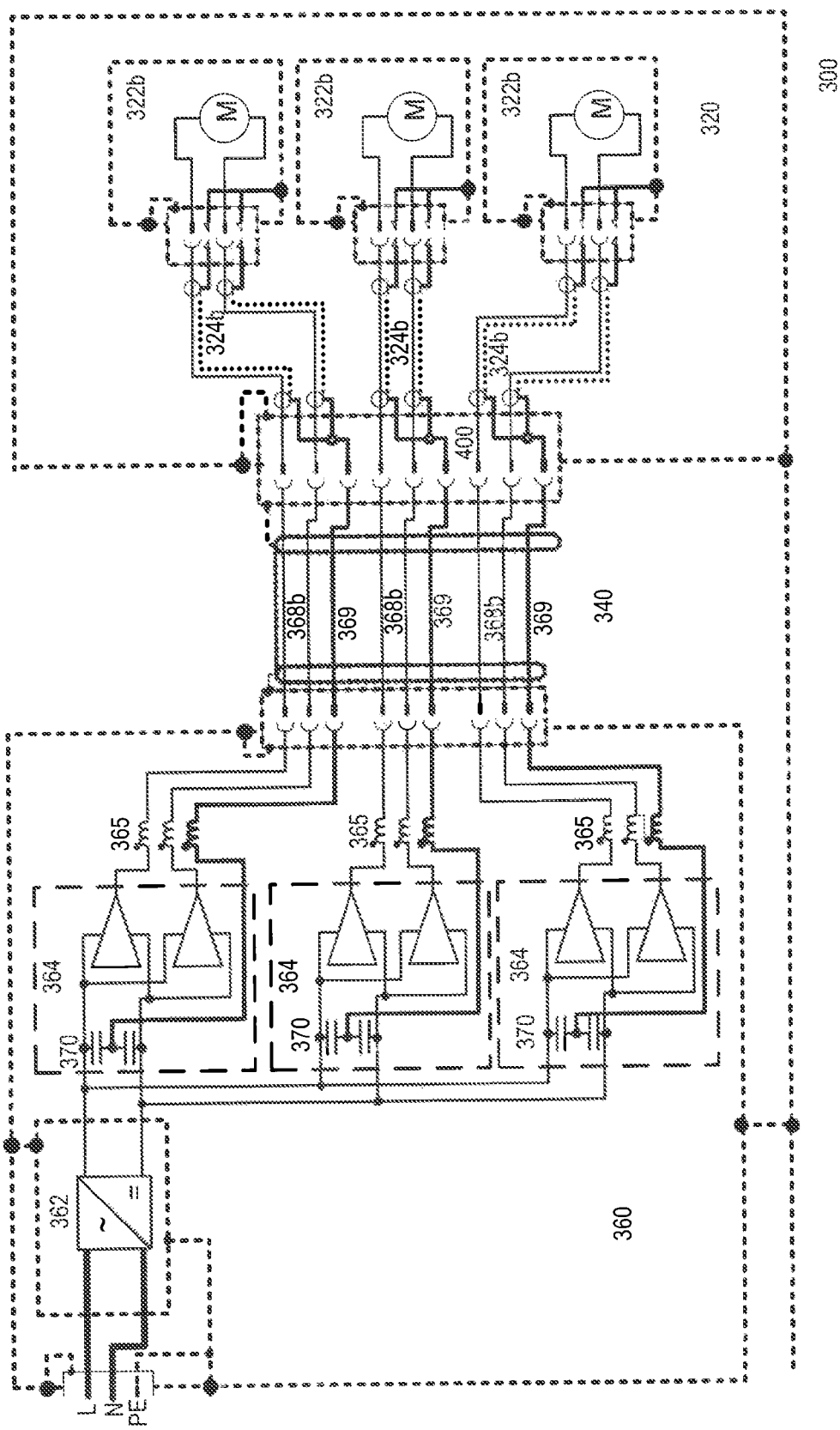

FIGS. 3a and 3b each show an exemplary actuation system 300 in a lithographic apparatus according to one embodiment of the present invention. The actuation system 300 comprises an actuator module 320, a power transmission module 340 and a power source module 360. The power source module 360 supplies electrical power to the actuator module 320 via the power transmission module 340.

In FIG. 3a the motors 322a comprise two three-phase motors. Consequently the power source module 360 provides a three-phase source via two power amplifiers 364, each fed from power supply 362. Equally the power transmission module 340 comprises cabling 368a for three-phase power. FIG. 3b differs only in that there are now three single-phase motors 322b, each fed by three single-phase power amplifiers 364 via single-phase cabling 368b. The FIG. 3a system applies to the PWM 3-phase AC application and the FIG. 3b system applies for a PWM DC supplied application. A multi-phase stepping actuator system can be applied in a similar way.

The actuator module 320 may be located in a low pressure environment, such as in a vacuum environment. The actuator module 320 includes electrical motors 322a, 322b and a number of first sets of cables 324a, 324b. Each first set of cables 324a, 324b is configured to connect to one of the electrical motors 322a, 322b at one end. In the example of FIG. 3a there are two sets, each comprising three cables (three-phase), and in the example of FIG. 3b there are three sets, each comprising two cables (single-phase).

Figure 4:
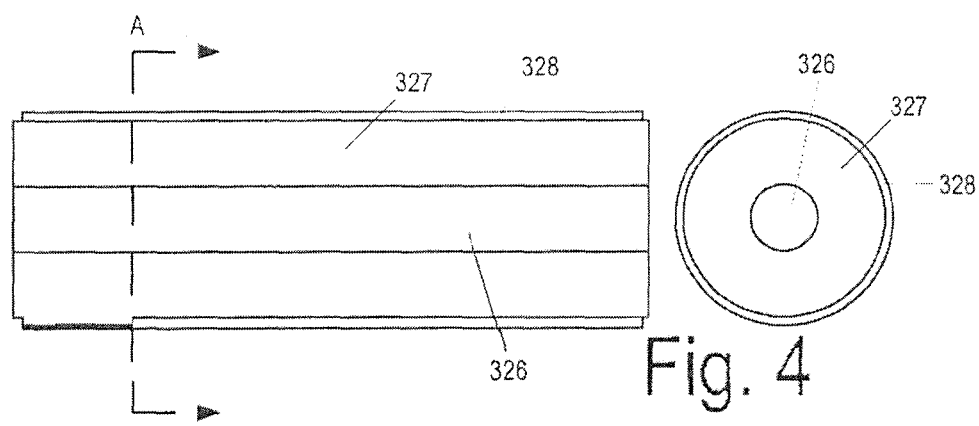
FIG. 4 depicts an exemplary cross-sectional view of a cable used in the actuator module.

FIG. 4, depicts the structure of the cables which make up the first sets of cables 324a, 324b. Each cable is comprised of a center conductor 326, surrounded by a layer of insulator 327 and an outer layer comprising a conductive shield 328, such as a Paschen shield. The shield 328 of the cables 324 is grounded to prevent corona discharge, usually by being connected to a chassis ground of the electrical motor 322. Therefore, the potential of the shield 328 of the cables 324 is zero.

Returning to FIGS. 3a and 3b, the chassis ground of the electrical motors 322 form part of a network of wires and conductive structural parts of the actuator system 300, such as the enclosure of the electrical motor 322, all of which are connected to a protective earth, PE. This protective earth network is depicted in the figures by the black dotted lines. None of the conductive parts of the electrical motor 322 are galvanically connected to protective earth, as a parasitic capacitance between the conductive parts and the enclosure of the electrical motor 322 exists.

In one exemplary embodiment, the electrical motors 322 are implemented as actuators in a lithographic apparatus, for example actuating a substrate table for positioning of the substrate table, the reticle clamp or the shutter blades.

The power source module 360 and power transmission module 340 each include second sets of cables 368, which match the first sets of cables 324 in their configuration and are for joining thereto, so as that power is conveyed from the power source module 360, via the power transmission module 340, to the actuator module 320. As these cables do not reside in a low-pressure atmosphere, they do not require any "corona" shielding, and are therefore of a more conventional design, each comprising a single insulated conductor. Inside the power source module 360, each of these second sets of cables 368 is connected to a power amplifier 364 via a multi-wire common-mode choke 365.

In the exemplary system 300, there is provided a common-mode return circuit, shown bolder than the other cables in FIGS. 3a and 3b. This comprises the shields 328 of each cable of the first set of cables 324 in the low pressure actuation module and dedicated common-mode return cables 369 in the power source module 360 and power transmission module 340. These dedicated common-mode return cables 369 are each comprised as an extra cable in each second set of cables 368.

Measurements have shown that the resolution of sensor systems is deteriorated as a result of common-mode currents which interfere with such sensor systems. These common-mode currents arise from motion control systems with electric motors (e.g., Wafer Stage), and is an issue for all machines with electric motors. It is therefore desirable to provide an extra common-mode return path to the power supply, rather than allow the common-mode current to flow through the chassis ground of the electrical motor. As a consequence of the extra common-mode return path by a conductive cable sheath or an extra "return" wire, the common-mode current flowing through the chassis ground of the electrical motor 322 is made very small and therefore causes less interference with other electronic systems, such as a sensor system in a lithographic apparatus.

In the example shown, each dedicated common-mode return cable 369 is connected to the power source 362 via the choke 365 and a divider 370, the latter to put the signal onto a common-mode of the power source 362. The choke 365 acts to control the path of the common-mode current, such that any common-mode component is carried by the common-mode return cable 369 and not through "chassis" ground. In one example, the choke 365 has tightly coupled coils, such that the mutual inductance M of the choke is substantially equal or at least similar to the self-inductance L of the choke. Also, the inductance of the choke 365 can be much higher than the total inductance of the cables in the actuator module 320, the power transmission module 340 and the power source module 360. The use of shielded power cables can reduce the effective inductance [$L_{eff}=2\cdot(L-M)$] of the cables being used, making the common-mode choke usage more effective.

The fact that the conductive shielding of the cables 324 in the actuator module 320 is grounded at zero volts means that it can form a part of the common-mode return circuit, and therefore no dedicated common-mode return cable is required in the actuator module, the cable shielding taking its place. In one example, the common-mode return for each motor 322 is comprised of the shielding of all three/both (depending on phase-type) cables comprised in a set, in parallel. The concept for using the extra return wire (as wire or cable sheath) can also be used with multi-phase stepping motor applications.

The depicted arrangement requires an electric feed-through 400 to carry both the current source and the common-mode return through the wall of the actuator module and into the low pressure atmosphere. As such the feed-through needs to be hermetically sealed, while not only connecting each cable of sets 324 to the corresponding cable of sets 368, but also connecting the shielding 328 of the cables 324 to a dedicated feed-through 400 for connection to the dedicated common-mode return wire 369. As each shield in a set of cables 324 is being used in parallel, the feed-through should connect all the shields in a set to the dedicated common-mode return wire 369. The return wire applied to each of the actuators is driven separately, even when driven from a single motion driver. In case actuators are used in series, the return wire shall be applied in parallel to the actuator supply wires while making contact to each and every actuator in that "actuator chain."

Figure 5B:
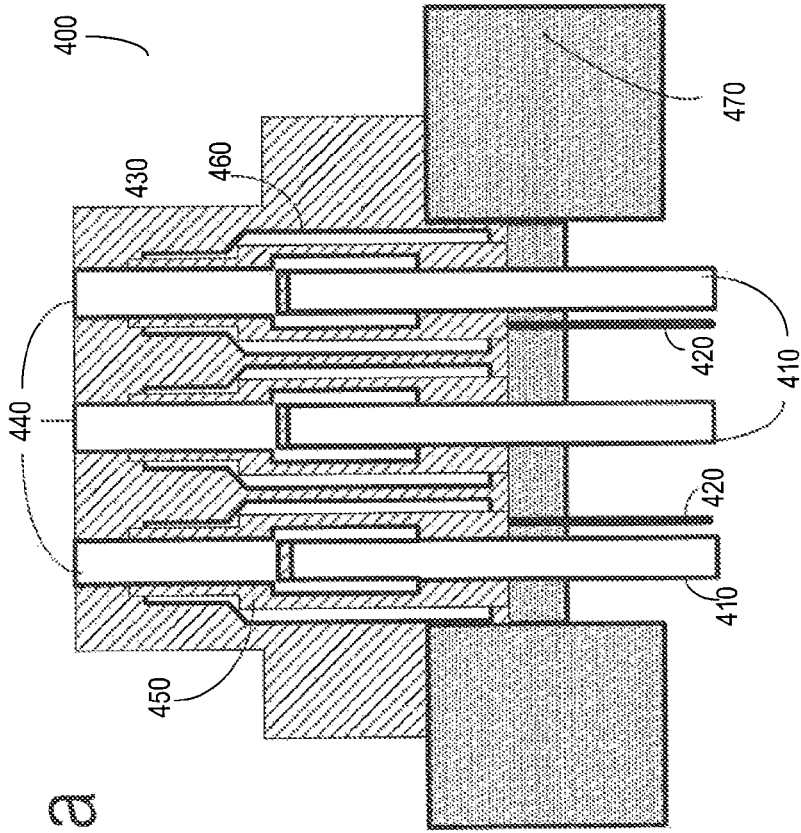
FIGS. 5a and 5b depict a vacuum wall feedthrough device according to an embodiment of the invention.
Figure 5A:
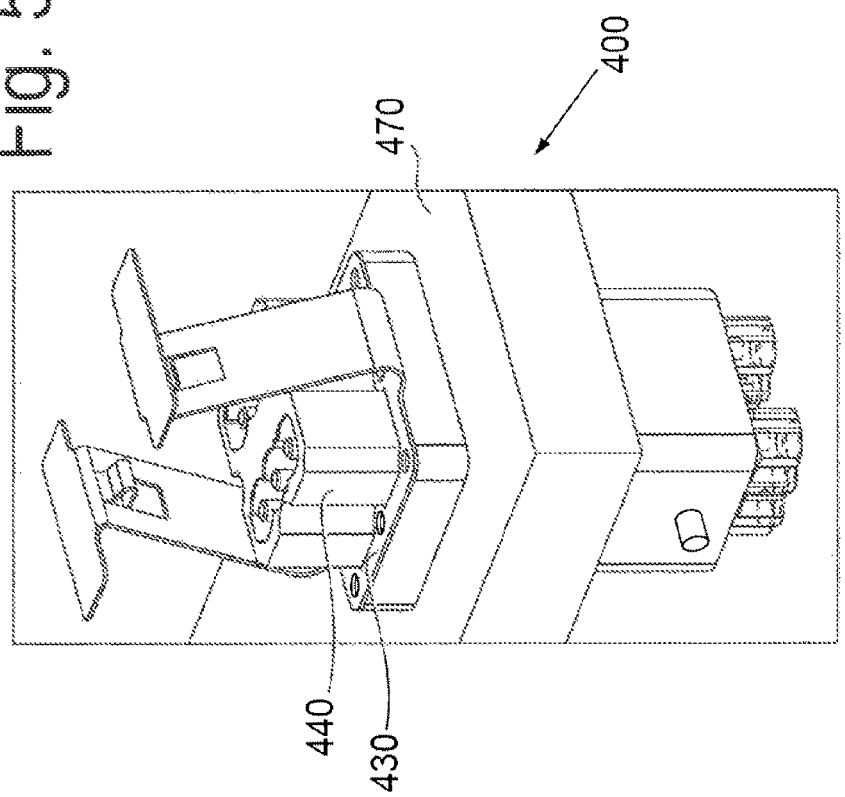

FIGS. 5a (isometric) and FIG. 5b (cross-section) both show a suitable feed-through connector 400 for passing the power source through the vacuum wall 410. A male connector is shown, although the same principles can equally be applied to a female connector. In this specific embodiment, feed-through connector 400 comprises six main feed-through conductors 410, each one for connection of a cable from the first set of cables to a cable from the second set of cables, and three auxiliary feed-through conductors 420, for the common-mode return circuit. The feed-through on the low pressure side (top in FIGS. 5a and 5b) comprises a plug 430 with main pins 440, each one of which is electrically connected to, and extends, a main feed-through conductor 410. Around each of these pins 440 is insulation 450, similar to that of the main plug body. Surrounding this insulation 450 is a conductive layer 460. When cables of the first set are plugged into the connector 400, their shielding will be electrically connected (either directly or via an intermediary conductor in the cable termination using for example, an electrical connector as disclosed in WO 2010/121844, which is incorporated by reference herein in its entirety, to this conductive layer 460.

Figure 6A:
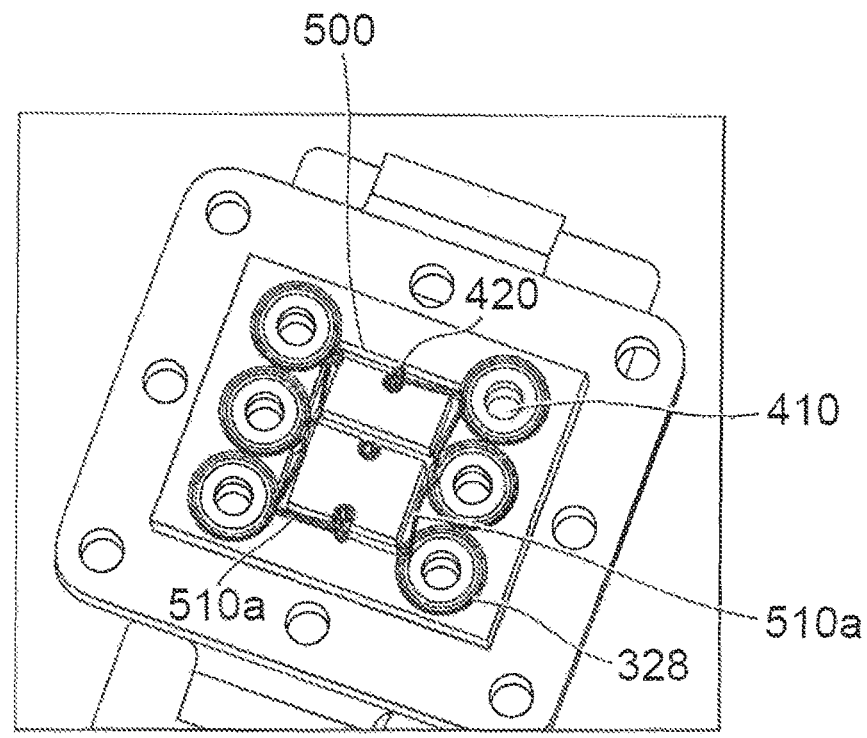
Figure 6B:
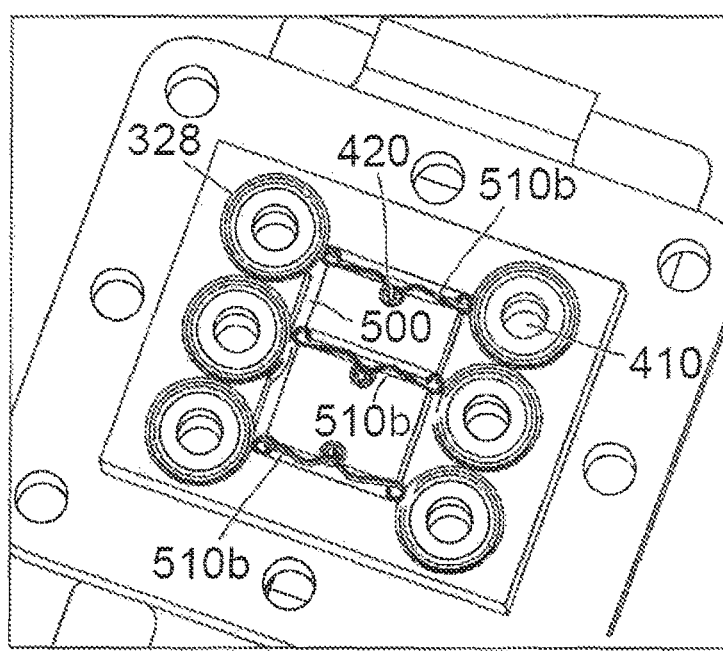
FIG. 6b depicts an exemplary spring configuration for the feedback device of FIGS. 5a and 5b when used in the system of FIG. 3b.

FIGS. 6a and 6b show a horizontal cross section through the feed-through connector (on the vacuum side) so as to illustrate how the common-mode signal is fed through the vacuum chamber wall 470. This is done via the auxiliary feed-through conductors 420. The feed-through connector 400 in this embodiment is specifically arranged to be usable in both actuation systems illustrated in FIG. 3a and FIG. 3b. This is done by providing channels 500 between the outer conductive layer 460 of the main feed-through conductors 410/pins 440, and the auxiliary feed-through conductors 420. These channels allow the location of conductive springs 510a, 510b. Conductive spring 510a is particularly designed for the PWM 3-phase actuation system illustrated in FIG. 3a, while conductive spring 510b is designed for the PWM DC actuation system illustrated in FIG. 3b.

In FIG. 6a, the pin 510a effectively connects together the shielding of one set of three cables carrying the three-phase power, and one of the auxiliary feed-through conductors 420. In this arrangement, one of the auxiliary feed-through conductors 420 is unused. As with the example shown in FIG. 3a, by using two springs 510a, the feed-through 400 can connect two sets of three-phase power sources to power two three-phase motors.

In FIG. 6b, each pin 510b effectively connects together the shielding of one set of two cables carrying single-phase power, and one of the auxiliary feed-through conductors 420. As with the example shown in FIG. 3b, by using three springs 510b, the feed-through 400 can connect three sets of single-phase power sources to power three single-phase motors.

Clearly this specific pin arrangement is an example, and other arrangements can be envisaged depending on the requirements of the system.

It should also be noted that the actuation system 300 described herein addresses the issue of magnetic stray field that results from the motor cables, such as the first plurality of cables 324 of the actuator module 320. This is because, for each of the first plurality of cables 324, the current in the center conductor 326 is equal but opposite to the current in the shield 328, this results in a net magnetic field equal to zero.

The above described embodiments of actuation systems 300 of the present invention are suitable for use in a lithographic apparatus to move or position a mask table or a substrate table. Additionally, embodiments of the present invention may be used to move or position any beam interceptor 210 (such as a blade) or provide power to any clamp (e.g., an electrostatic clamp) used to fix a mask or a substrate to a table that may form part of a lithographic apparatus. However, the actuation system according to embodiments of the present invention is not limited to use as part of a lithographic apparatus. The actuation system is applicable in other situations where an actuator is located in low pressure environments and the electrical cables carry high voltages in the low pressure environments.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams, electron or X-ray beams.

The term "lens," where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An actuator system comprising:
   an actuator module comprising an actuator and actuator cables configured to connect the actuator to a power source configured to provide power to the actuator;
   transmission cables for connecting the power source to the actuator cables; and
   a common-mode signal return circuit comprising electrically conductive shielding of the actuator cables and a dedicated common-mode signal return conductor from the actuator to the power source.

2. The actuator system as claimed in claim 1, further comprising a plurality of actuators and a separate common-mode signal return conductor for each actuator.

3. The actuator system as claimed in claim 1, wherein the electrically conductive shielding is grounded.

4. The actuator system as claimed in claim 3, wherein the grounded electrically conductive shielding is coupled in parallel to provide a part of the common-mode signal return circuit, wherein the actuator cables are configured to provide power to a single actuator, and are configured to provide the part of the common-mode signal return circuit only for the single actuator.

5. The actuator system as claimed in claim 4, further comprising a feed-through connection configured to connect the actuator cables to the transmission cables, while providing a feed-through for the common-mode signal return circuit.

6. The actuator system as claimed in claim 1, further comprising a choke between the power source and each of the transmission cables and the dedicated common-mode signal return conductor, the choke being operable to control the path of a common-mode current such that any common-mode component is carried by the common-mode signal return circuit.

7. The actuator system as claimed in claim 6, wherein a mutual inductance of the choke is substantially equal to a self-inductance of the choke, and the self-inductance of the choke is at least an order of magnitude higher than that of a total inductance of cables comprised in the system.

8. The actuator system as claimed in claim 1, further comprising a divider between the power source and the dedicated common-mode signal return conductor.

* * * * *

UNITED STATES PATENT AND TRADEMARK OFFICE
CERTIFICATE OF CORRECTION

PATENT NO. : 8,947,638 B2  
APPLICATION NO. : 13/299687  
DATED : February 3, 2015  
INVENTOR(S) : Damen et al.

Page 1 of 1

It is certified that error appears in the above-identified patent and that said Letters Patent is hereby corrected as shown below:

Title page, (57) Abstract lines 5-6, after "An exemplary actuation system includes", please delete "comprises".

Signed and Sealed this  
Twenty-second Day of September, 2015

Michelle K. Lee  
*Director of the United States Patent and Trademark Office*